(12) United States Patent
Lu et al.

(10) Patent No.: US 8,138,825 B2
(45) Date of Patent: Mar. 20, 2012

(54) MULTI-CHIP STACK STRUCTURE AND SIGNAL TRANSMISSION METHOD THEREOF

(75) Inventors: Hsin-Chia Lu, Taipei (TW); Guan-Ming Wu, Yunlin County (TW); Chun Pan, Taipei (TW)

(73) Assignee: National Taiwan University, Taipei (TW)

( * ) Notice: Subject to any disclaimer, the term of this patent is extended or adjusted under 35 U.S.C. 154(b) by 76 days.

(21) Appl. No.: 12/785,399

(22) Filed: May 21, 2010

(65) Prior Publication Data

US 2011/0050336 A1   Mar. 3, 2011

(30) Foreign Application Priority Data

Sep. 1, 2009 (TW) .............................. 98129441 A (51) Int. Cl.
*H03C 1/00* (2006.01)
*H03D 1/00* (2006.01)
*H03K 7/02* (2006.01)
*H03K 9/02* (2006.01)
*H04L 25/00* (2006.01)

(52) U.S. Cl. ........ 329/311; 332/106; 332/115; 375/286; 375/353

(58) Field of Classification Search .................. 329/311, 329/347; 332/106, 115, 116; 375/286, 353
See application file for complete search history.

(56) References Cited

U.S. PATENT DOCUMENTS 7,813,259 B2 * 10/2010 Kuroda et al. ................ 370/201
8,008,799 B2 * 8/2011 Rofougaran ..................... 307/3

OTHER PUBLICATIONS

Hsin-Chia Lu et al., "Coupling Coefficient Improvement for Inductor Coupled Vertical Interconnect in 3D IC Die Stacking", 2009 Electronic Components and Technology Conference, 1207-1212.

* cited by examiner

*Primary Examiner* — David Mis
(74) *Attorney, Agent, or Firm* — CKC & Partners Co., Ltd.

(57) ABSTRACT

A multi-chip stack structure and a signal transmission method are disclosed in specification and drawing, where the multi-chip stack structure includes first and second chips. The first chip includes a first inductance coil with a first series capacitor, and the second chip includes a second inductance coil with a second series capacitor. The first and second inductance coils are magnetically coupled to each other. The magnetically coupled inductance coils and the capacitors constitute a coupling filter.

19 Claims, 12 Drawing Sheets

MULTI-CHIP STACK STRUCTURE AND SIGNAL TRANSMISSION METHOD THEREOF

RELATED APPLICATIONS

This application claims priority to Taiwan Application Serial Number 98129441, filed Sep. 1, 2009, which is herein incorporated by reference.

BACKGROUND

1. Technical Field

The present disclosure relates to circuit architectures and communication methods thereof, and more particularly, multi-chip stack structures and signal transmission methods thereof.

2. Description of Related Art

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and length of interconnections between devices as the number of devices increases. When the number and length of interconnections increase, both circuit RC delay and power consumption increase.

In an attempt to further increase circuit density, three-dimensional (3D) integrated circuits (ICs) have been investigated. In a typical formation process of a 3D IC, two chips are bonded together, so as to avoid using a long transmission distance in a single large-area chip. In the 3D IC, signals are transmitted between two chips through silicon via; however, in this way, added processes of IC chip manufacturing and more masks must be required.

In view of the foregoing, there is an urgent need in the related field to provide a way to transmit signals between chips efficiently.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to multi chip stack structures and signal transmission methods thereof for performing wireless transmission between chips.

According to one embodiment of the present invention, a multi-chip stack structure includes a first chip and a second chip. The second chip is stacked on the first chip. The first chip includes a first series capacitor and a first inductance coil, where the first series capacitor connected to the first inductance coil in series. The second chip includes a second series capacitor and a second inductance coil, where the second series capacitor connected to the second inductance coil in series. The second inductance coil is magnetically coupled with the first inductance coil. The capacitors and the magnetically coupled inductance coils constitute a coupling filter. Thus, the wireless transmission between the first and second chips can be performed through the coupling filter.

According to another embodiment of the present invention, a multi-chip stack structure includes a plurality of chips that are stacked, in which at least two chips each include at least one series capacitor and an inductance coil connected to each other in series, wherein the series capacitors and the magnetically coupled inductance coils constitute a coupling filter. Thus, the wireless transmission between the two chips can be performed through the coupling filter.

According to yet another embodiment of the present invention, a signal transmission method for aforesaid multi-chip stack structure, the signal transmission method includes steps as follows. First, a transmission signal is transmitted from one of the two chips to the second chip through the coupling filter. Then, the second chip acquires the transmission signal through the coupling filter. Thus, the wireless transmission between the two chips is performed through the coupling filter.

Technical advantages are generally achieved, by embodiments of the present invention, as follows:

1. The wireless transmission can be performed through a band-pass band of the coupling filter to increase a transmission coefficient, so that communication quality can be improved; and 2. Data can be transmitted wirelessly with low energy due to the increase in the transmission coefficient. Therefore, energy saving can be accomplished.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In practice, the wireless transmission between the two chips may be performed by means of capacitive or inductive coupling. When using the capacitive coupling the transmission distance is 1-9 micrometers; comparatively, when inductive coupling is used the transmission distance is greater than 10 micrometers. If it's very difficult to reduce the thickness of the chip, or if varied chips are stacked, using the inductive coupling will be suitable for the wireless transmission.

Figure 1:
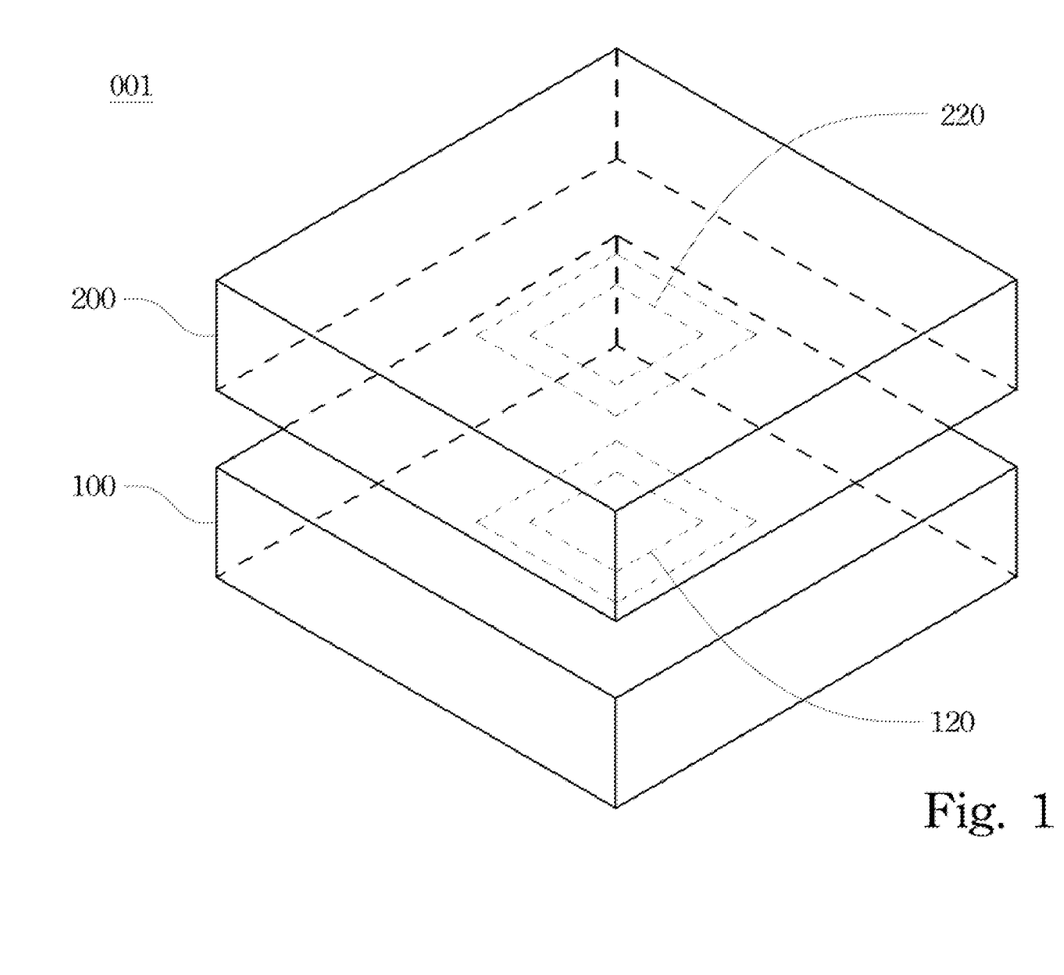
FIG. 1 is a perspective drawing of an inductive coupling structure according to the present disclosure.

Refer to FIG. 1. FIG. 1 is a perspective drawing of an inductive coupling structure according to the present disclosure. As shown in FIG. 1, the first chip 100 has a first inductance coil 120, and the second chip 200 has a second inductance coil 220. The second chip 200 is stacked on the first chip 100, where the first inductance coil 120 is magnetically coupled with the second inductance coil 220. In FIG. 1, the first inductance coil 120 directly faces the second inductance coil 220, so as to facilitate the inductive coupling. In practice, one inductance coil may be superimposed or overlapped on another inductive coil. Those with ordinary skill in the art may flexibly design the orientation of the two inductance coils depending on the desired application. Thus, the two magnetically coupled inductance coils are disposed in different chips 100 and 200 respectively, so that data can be transmitted through inductive coupling.

Figure 2:
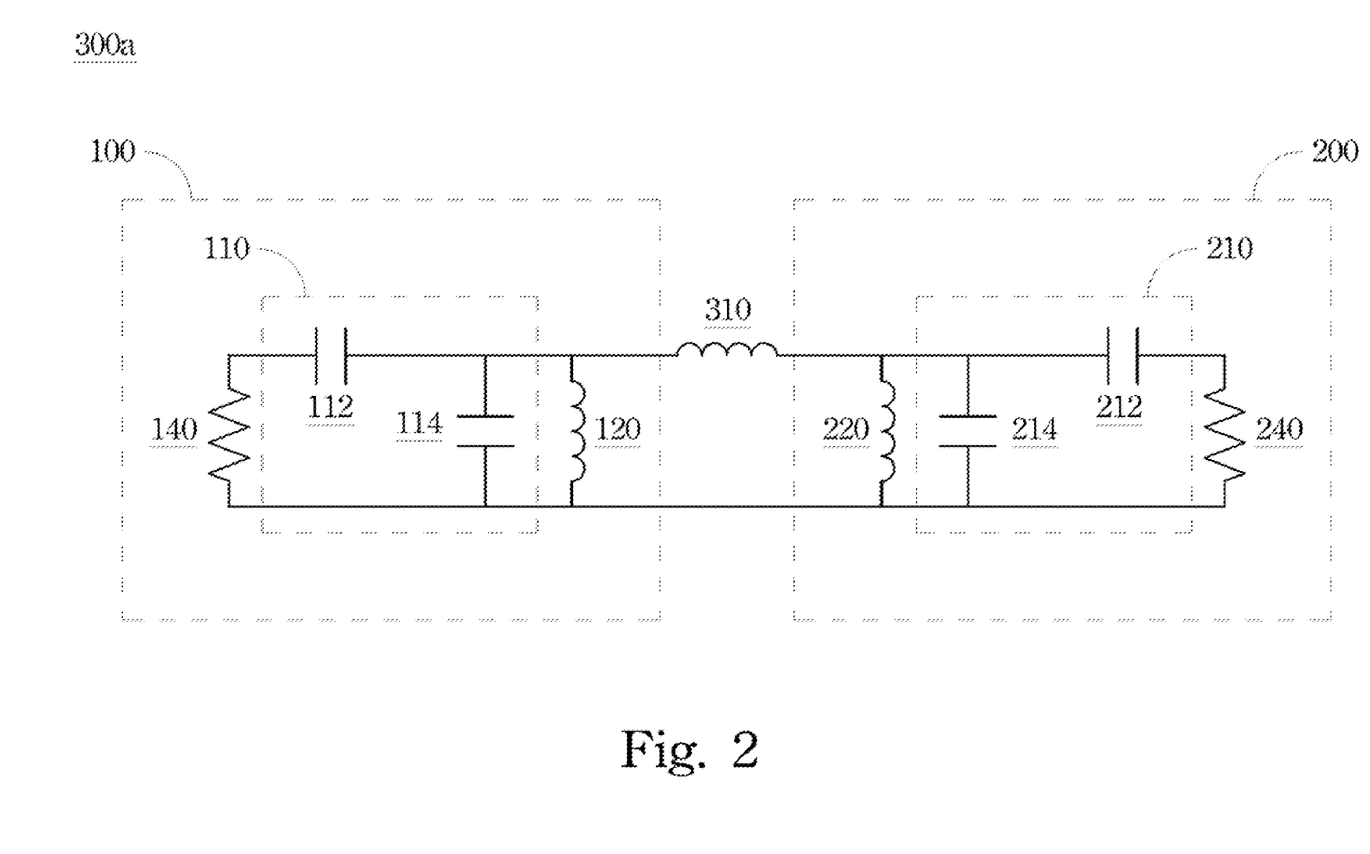
FIG. 2 is an equivalent-circuit diagram of a coupling filter having capacitor elements with inductance coils of FIG. 1 according to one embodiment of the present disclosure.

However, it's difficult to further increase a transmission coefficient using two magnetically coupled inductance coils. To improve the transmission coefficient, refer to FIG. 2. FIG. 2 is an equivalent-circuit diagram of a coupling filter 300a with capacitor elements 110 and 210 with the inductance coils 120 and 220 of FIG. 1 according to one embodiment of the present disclosure.

In FIG. 2, the first chip 100 includes the first capacitive element 110 and the first inductance coil 120; the second chip 200 includes the second capacitive element 210 and the second inductance coil 220. The source impedance 140 is electrically connected to the first capacitive element 110, and the first capacitive element 110 is electrically connected to the first inductance coil 120; the load impedance 240 is electrically connected to the second capacitive element 210, and the second capacitive element 210 is electrically connected to the second inductance coil 220, wherein the second inductance coil 220 is magnetically coupled with the first inductance coil 120, so that the mutual inductance 310 is generated between the inductance coils 120 and 220. The coupling filter 300a is comprised of the two inductance coils 120 and 220 magnetically coupled with the capacitors 112, 114, 212 and 214. Thus, the wireless transmission between the first and second chips 100 and 200 can be performed through the coupling filter 300a so as to improve the transmission coefficient.

As shown in FIG. 2, the first capacitive element 110 includes the first series capacitor 112 and the first shunt capacitor 114. The first shunt capacitor 114 is connected in parallel to the first inductance coil 120; the first series capacitor 112 is connected to the first inductance coil 120 in series, where the first series capacitor 112 is electrically connected to the first shunt capacitor 114. Similarly, the second capacitive element 210 includes the second shunt capacitor 214 and the second series capacitor 212. The second shunt capacitor 214 is connected in parallel to the second inductance coil 220; the second series capacitor 212 is connected in series to the second inductance coil 220, where the second series capacitor 212 is electrically connected to the second shunt capacitor 214.

Figure 3:
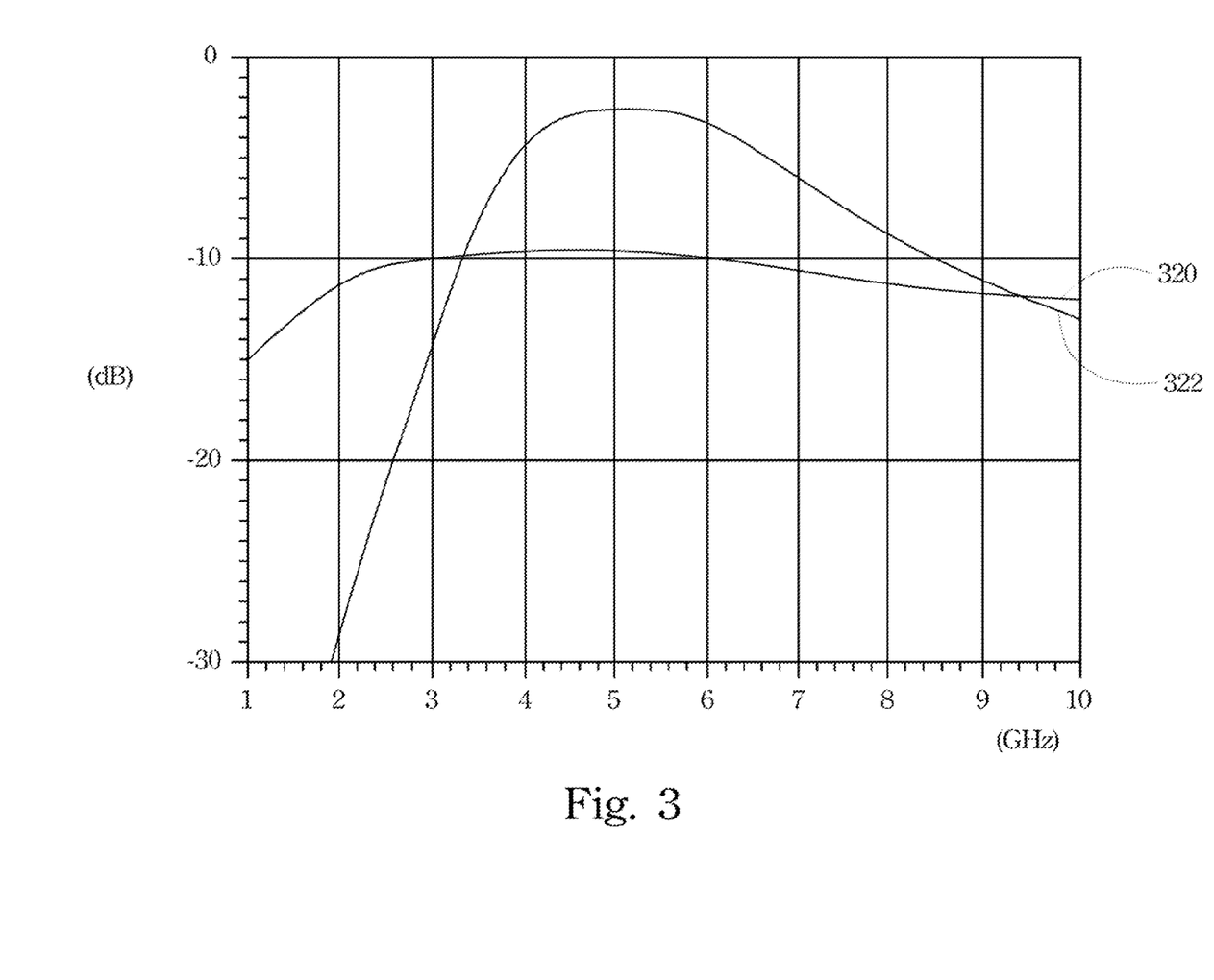
FIG. 3 is a frequency response graph of the coupling filter of FIG. 2 and the inductive coupling structure of FIG. 1.

FIG. 3 is a frequency response graph of the coupling filter 300a of FIG. 2 and the inductive coupling structure 001 of FIG. 1. As shown in FIG. 3, the curve 320 represents a transmission coefficient of the inductive coupling structure 001 (i.e., the capacitors are not added). The curve 322 represents another transmission coefficient of the coupling filter 300a (i.e., the capacitors are added). When the capacitors are added, the transmission coefficient, shows an increase of 6 dB, in the 3 GHz-9 GHz frequency range.

Figure 4:
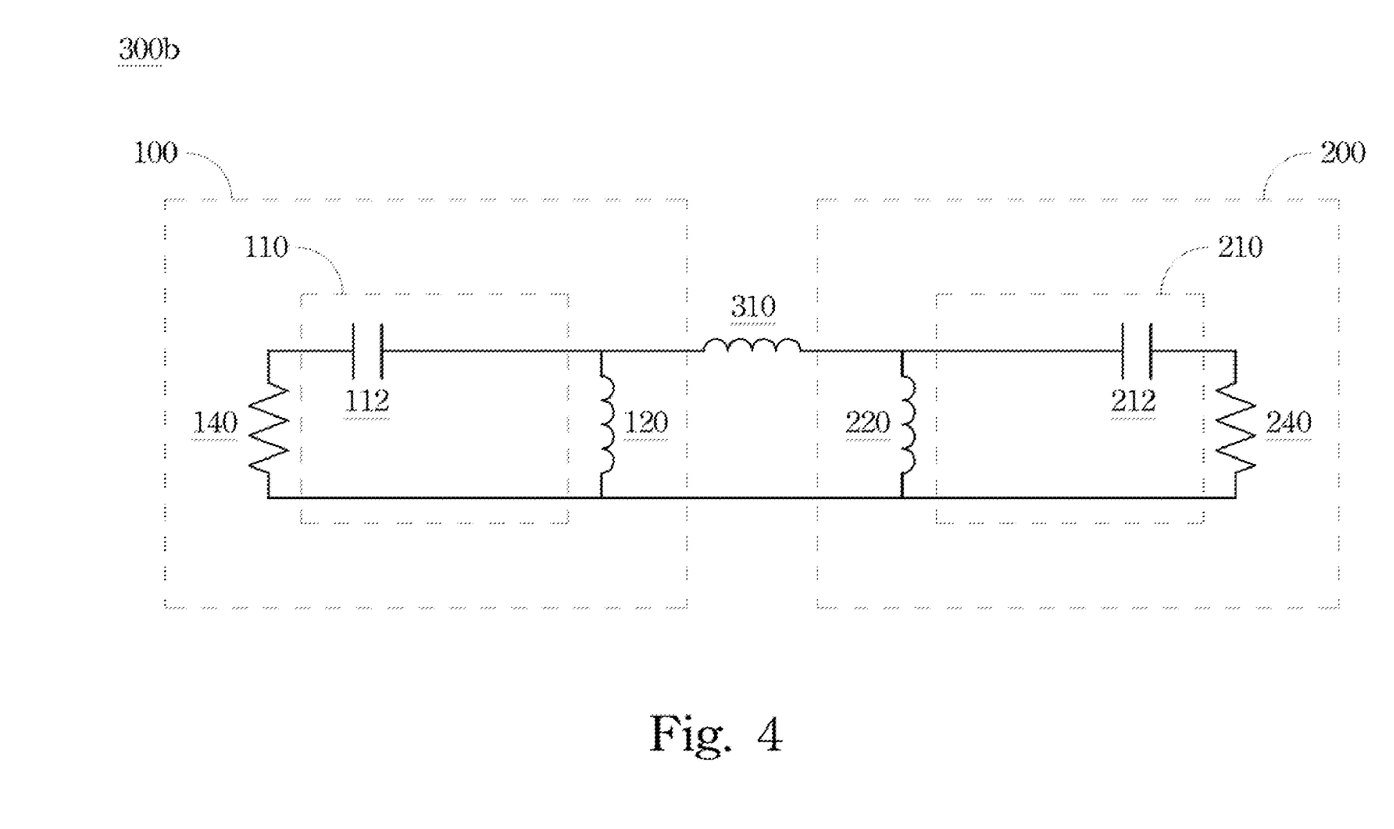
FIG. 4 is an equivalent-circuit diagram of a coupling filter having capacitor elements with inductance coils of FIG. 1 according to another embodiment of the present disclosure.

FIG. 4 is an equivalent-circuit diagram of a coupling filter 300b having capacitor elements 110 and 210 with inductance coils 120 and 220 of FIG. 1 according to another embodiment of the present disclosure. Compare FIG. 2 with FIG. 4, the coupling filter 300b is essentially the same as the coupling filter 300a, except that the capacitors 114 and 214 are omitted. In one or more embodiment, the coupling filter 300a or 300b can serve as a band-pass filter.

Figure 5:
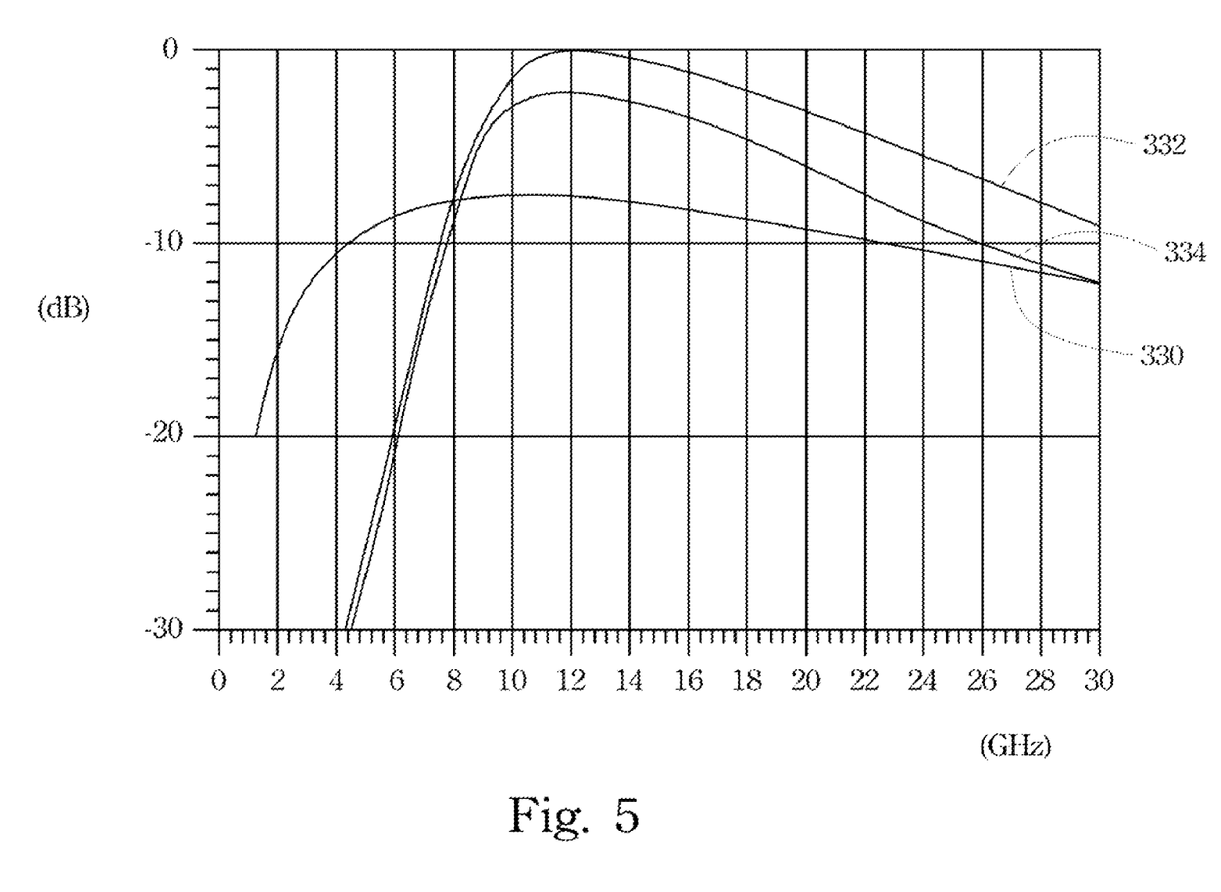
FIG. 5 is a frequency response graph of the coupling filter of FIG. 4 and the inductive coupling structure of FIG. 1.

FIG. 5 is a frequency response graph of the coupling filter 300b of FIG. 4 and the inductive coupling structure 001 of FIG. 1. As shown in FIG. 5, the curve 330 represents a transmission coefficient of the inductive coupling structure 001 (i.e., the capacitors are not added). The curve 332 represents another transmission coefficient of the coupling filter 300b in circuit simulations (i.e., the capacitors 112 and 212 are added). The curve 334 represents yet another transmission coefficient of the coupling filter 300b in electromagnetic simulations (i.e., the capacitors 112 and 212 are added). When the capacitors are added, the transmission coefficient shows an increase of 6 dB similarly.

In view of above, the series capacitors are added to improve the transmission coefficient efficiently. Two circuit architectures are shown in FIG. 2 and FIG. 4, and the increase in the transmission coefficient is shown in FIG. 3 and FIG. 5. Thus, data can be transmitted wirelessly with low energy due to the increase in the transmission coefficient. Therefore, energy can be saved.

Figure 6:
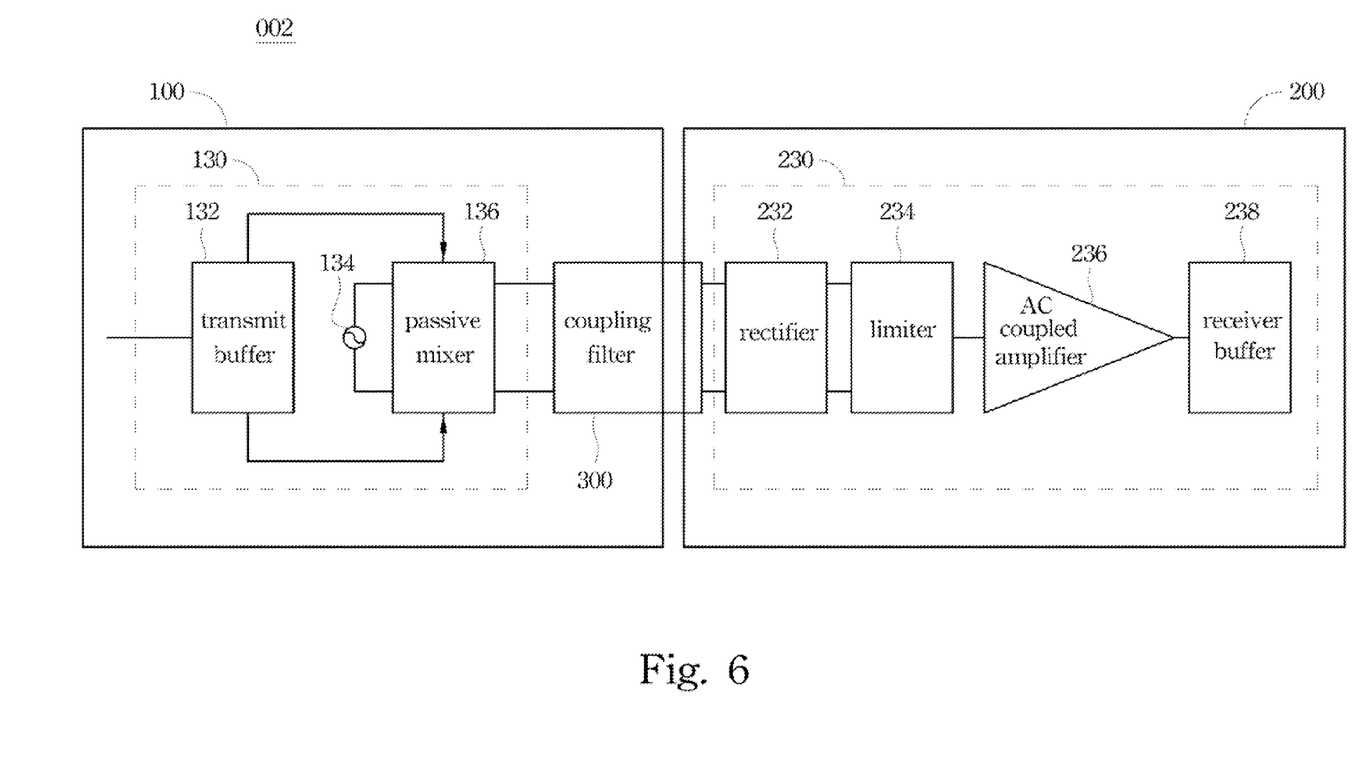
FIG. 6 is a block diagram of a multi-chip stack structure according to one embodiment of the present disclosure.

FIG. 6 is a block diagram of a multi-chip stack structure 002 according to one embodiment of the present disclosure. As shown in FIG. 6, the multi-chip stack structure 002 includes the first and second chips 100 and 200 that are stacked. The coupling filter 300 is constituted in the first and second chips 100 and 200. The coupling filter 300 may be the coupling filter 300a of FIG. 2 or the coupling filter 300b of FIG. 4. Those with ordinary skill in the art may choose the coupling filter 300a or 300b depending on the desired application. In use, the coupling filter 300 can serve as the band-pass filter.

In this embodiment, the first chip 100 may further include an emitter 130, and the second chip 200 may further include a receiver 230. The emitter 130 is electrically connected to the coupling filter 300, and the receiver 230 is also electrically connected to the coupling filter 300.

In use, the emitter 130 can transmit a transmission signal to the second chip 200 through the coupling filter 300. The receiver 230 can acquire the transmission signal through the coupling filter 300.

Moreover, the frequency of the transmission signal can be within the band-pass band of the coupling filter 300, so as to facilitate the modulated signal through the coupling filter 300, thereby the communication quality can be improved.

In this embodiment, the emitter 130 transforms a digital signal into a modulated signal as aforesaid transmission signal and transmits the modulated signal to the receiver 230 through the coupling filter 300. Then, the receiver 230 receives and demodulates the modulated signal.

Alternatively, un-modulated signals are transmitted between the chips 100 and 200 through the coupling filter 300. In another embodiment, the emitter in the chip 100 can transmits the un-modulated signal as aforesaid transmission signal to the chip 200 through the coupling filter 300, and then the receiver in the chip 200 acquires the un-modulated signal. Similarly, the emitter in the chip 200 transmits the un-modulated signal as aforesaid transmission signal to the chip 100 through the coupling filter 300, and then the receiver in the chip 100 acquires the un-modulated signal.

Refer to FIG. 6. In the present embodiment the signal-transmission is accomplished by means of Amplitude-shift keying (ASK), and the emitter 130 may include a transmit buffer 132, a local oscillator 134 and a passive mixer 136.

The transmit buffer 132 is electrically connected to the passive mixer 136. The local oscillator 134 is electrically connected to the passive mixer 136. The passive mixer 136 is electrically connected to the coupling filter 300.

The oscillation frequency of the local oscillator 134 conforms to the mid-band frequency of the coupling filter 300. The transmit buffer 132 can acquire a digital signal from a periphery circuit (not shown) to buffer the digital signal to drive the passive mixer 136, so that the passive mixer 136 can modulate the digital signal into a ASK modulated signal based on the oscillation frequency, wherein the ASK modulated signal serves as aforesaid modulated signal.

The receiver 230 may include a rectifier 232, a limiter 234, an AC coupled amplifier 236 and a receiver buffer 238. The rectifier 232 is electrically connected to the limiter 234. The limiter 234 is electrically connected to the AC coupled amplifier 236. The AC coupled amplifier 236 is electrically connected to the receiver buffer 238.

In use, the rectifier 232 transforms the modulated signal that passes through the coupling filter 300 into a demodulated signal. The limiter 234 can amplify the demodulated signal. After the demodulated signal is amplified, the AC coupled amplifier 236 can increase amplitude of the demodulated signal. After the amplitude of the demodulated signal is increased, the receiver buffer 238 is capable of buffering the demodulated signal to drive a capacitive load, so as to measure the demodulated signal.

In FIG. 6, it should be noted that the emitter 130 is configured in the first chip 100 and the receiver 230 is configured in the second chip 200 for illustrative purposes only. Additionally or alternatively, the emitter and elements thereof may be configured in the second chip 200, and the receiver and elements thereof may be configured in the first chip 100. In other words, the second chip 200 may include the emitter, and the first chip 100 may include the receiver, so that the second chip 200 can transmit signals to the first chip 100. Moreover, the first and second chips 100 and 200 each have the emitter and the receiver, so that bi-directional transmission can be accomplished.

Figure 7:
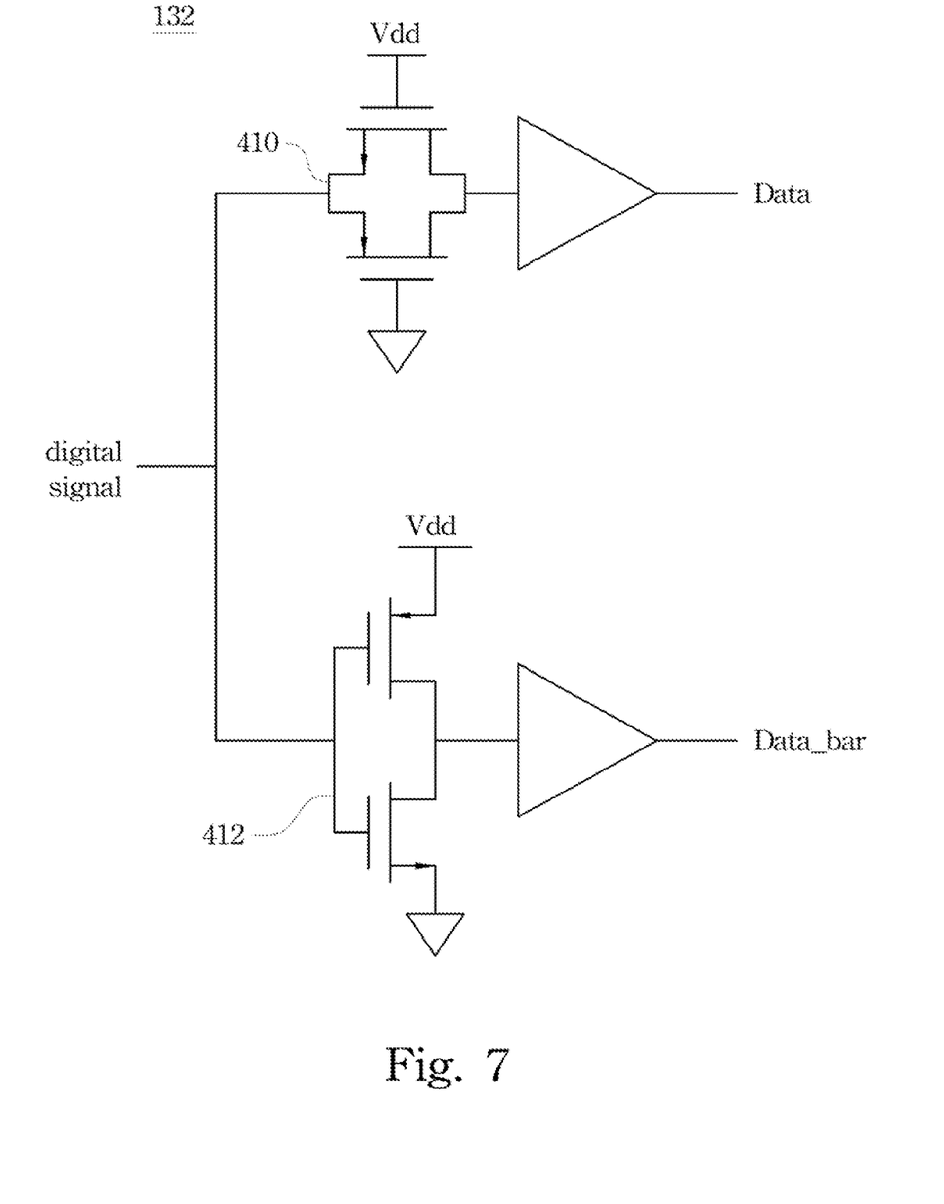
FIG. 7 is a circuit diagram of a transmit buffer of FIG. 6.

FIG. 7 is a circuit diagram of the transmit buffer 132 of FIG. 6. In FIG. 7, the positive supply voltage Vdd is coupled with the transmit buffer 132, and the transmit buffer 132 includes a transmission gate 410 and a phase inverter 412. The transmission gate 410 receives an external digital signal, so as to generate a positive phase signal (Data). The phase inverter 412 receives the external digital signal, so as to generate an inverted signal (Data_bar). Therefore, the transmit buffer 132 can output the positive phase signal and the inverted signal to drive the passive mixer 136.

Figure 8:
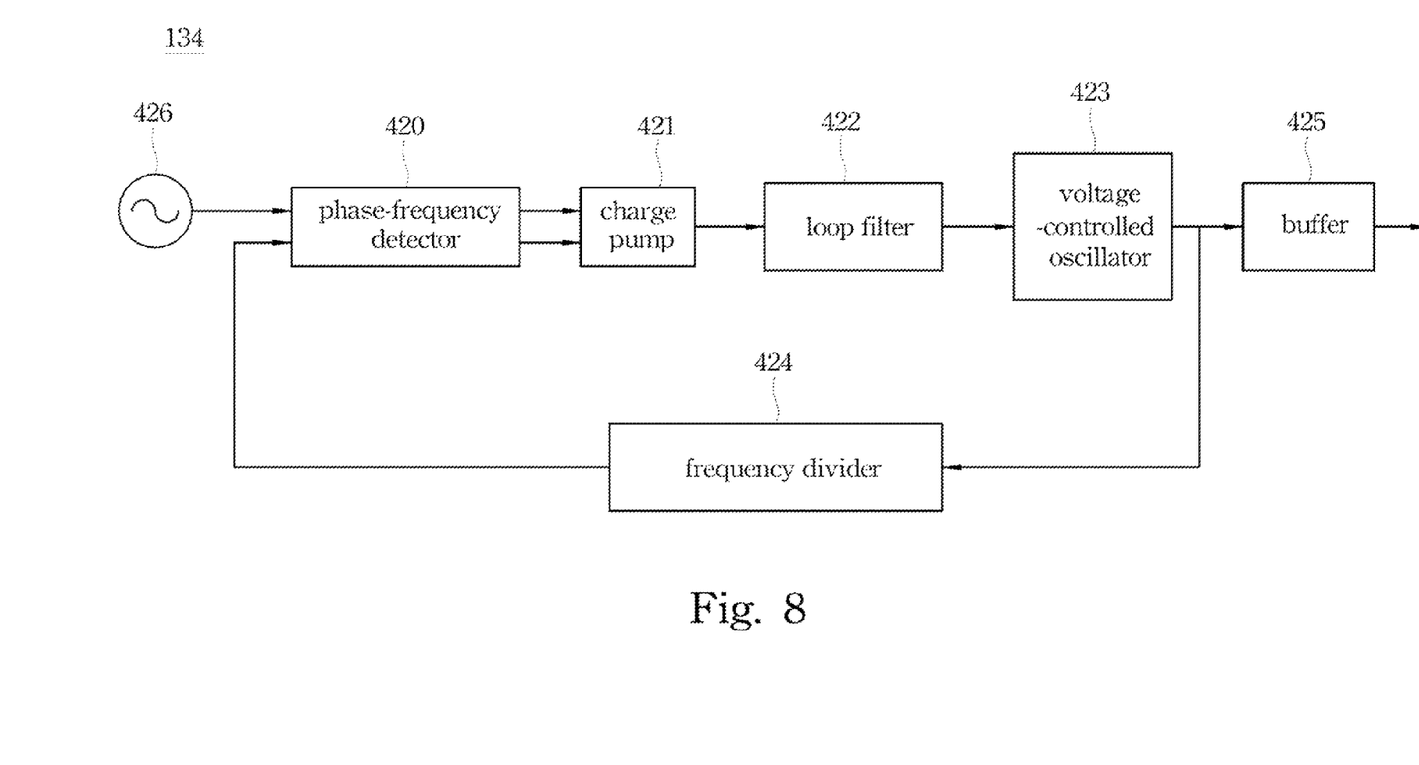
FIG. 8 is a block diagram of a local oscillator of FIG. 6.

FIG. 8 is a block diagram of a local oscillator 134 of FIG. 6. In FIG. 8, the local oscillator 134 is a phase locked loop, which includes a phase-frequency detector 420, a charge pump 421, a loop filter 422, a voltage-controlled oscillator 423, a frequency divider 424 and a buffer 425.

In use, the oscillation source 426 generates an oscillator signal as a reference signal, and a closed-loop control system consists of the phase-frequency detector 420, the charge pump 421, the loop filter 422, the voltage-controlled oscillator 423 and the frequency divider 424 is operated under a feedback mechanism, so that the output of the buffer 425 maintains at an oscillation frequency, where the oscillation frequency conforms to the mid-band frequency of the coupling filter 300. For example, the oscillation source 426 generates an external oscillator signal is 20 MHz as the reference signal, and then the frequency divider 424 can divide the feedback signal frequency by 256. When the controlling voltage of the voltage-controlled oscillator 423 is settling, the output of the voltage-controlled oscillator 423 is locked at 5.12 GHz.

Figure 9:
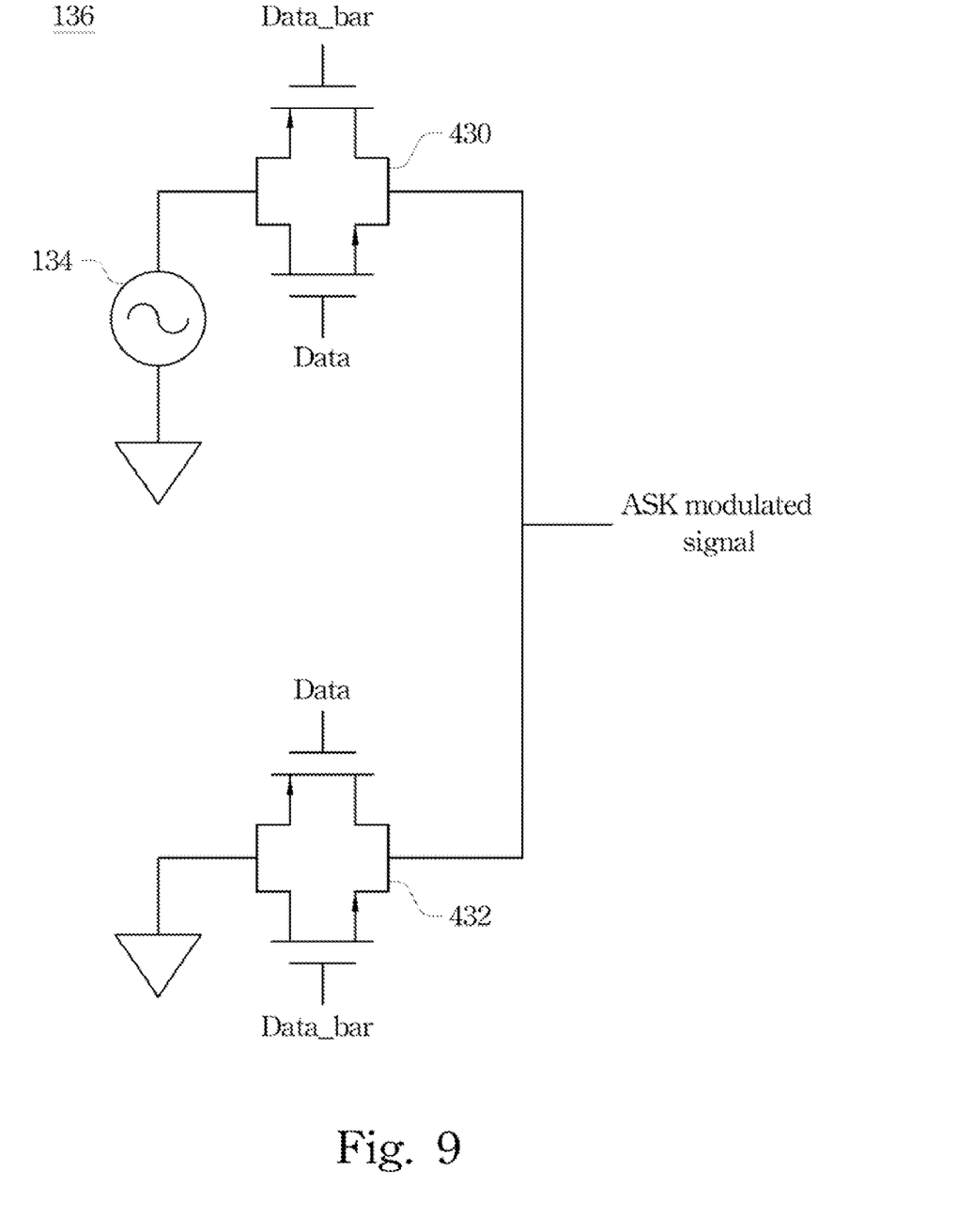
FIG. 9 is a circuit diagram of a passive mixer of FIG. 6.

FIG. 9 is a circuit diagram of a passive mixer of FIG. 6. The passive mixer 136 comprises a plurality of switches 430 and 432. In use, the above transmit buffer 132 receive the digital signal to output the positive phase signal (Data) and the inverted signal (Data_bar), and then the passive mixer 136 can be driven by receiving the positive phase signal and the inverted signal. When the digital signal is at a high level, the switch 430 switches the output terminal 434 to couple to the local oscillator 134. When the digital signal is at a low level, the switch 432 switches the output terminal 434 to ground. Thus, the passive mixer 136 can output the ASK modulated signal.

Figure 10:
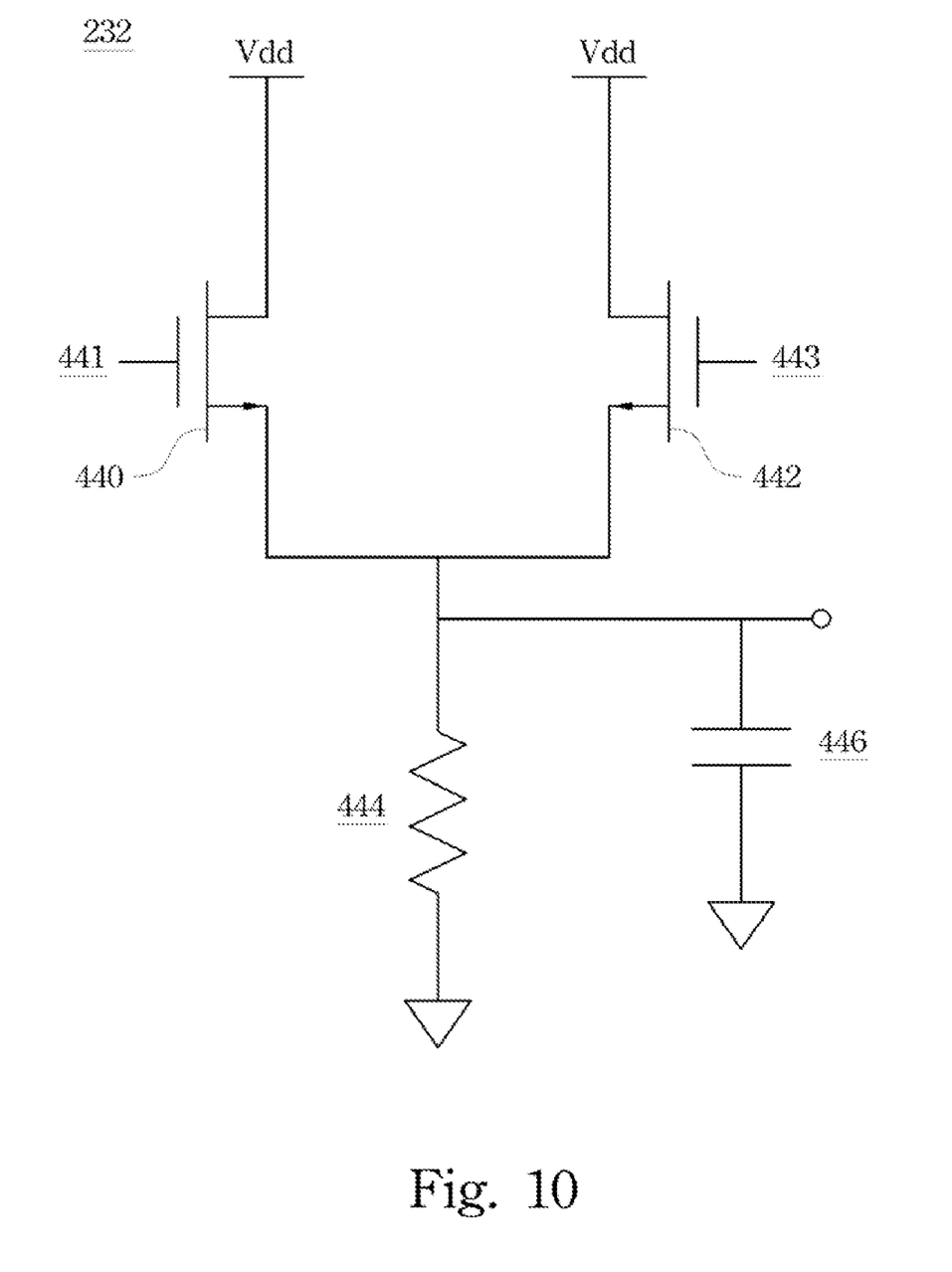
FIG. 10 is a circuit diagram of a rectifier of FIG. 6.

FIG. 10 is a circuit diagram of the rectifier 232 of FIG. 6. In FIG. 10, the positive supply voltage Vdd is coupled to the rectifier 232 and the rectifier 232 may include a transistor 440 and 442, a resistor 444 and a capacitor 446. In this way, the gates 441 and 443 can receive the modulated signal through the coupling filter 300. The rectifier 232 can transform the negative wave of the sine wave into the positive wave, so as to transform the modulated signal into the demodulated signal. Moreover, the capacitor 446 functions as a low pass filter to reduce high frequency noise.

Figure 11:
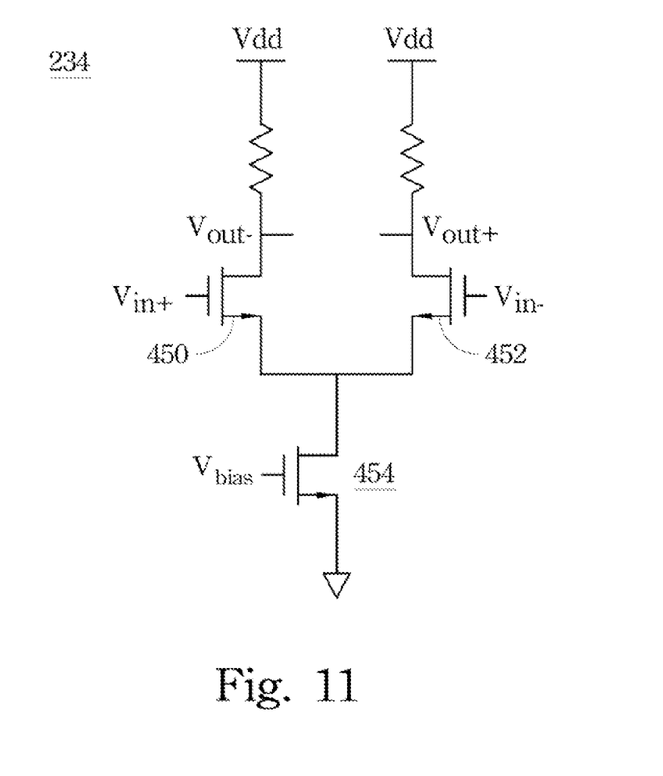
FIG. 11 is a circuit diagram of a limiter of FIG. 6.

FIG. 11 is a circuit diagram of the limiter 234 of FIG. 6. In FIG. 11, the positive supply voltage Vdd is coupled to the rectifier 232, and the limiter 234 is a differential pair that functions as a high-gain and broadband amplifier. Bias voltage (Vbias) is supplied to the transistor 454, where the gates of the transistor 450 and 452 receive differential mode input voltage, and then the drains of the transistor 450 and 452 provide differential mode output voltage. Thus, the limiter 234 can improve the gain and the bandwidth of the demodulated signal. Moreover, the limiter 234 may include a plurality of differential pairs. For example, six differential pairs are connected in series, which constitute a limiter.

Figure 12:
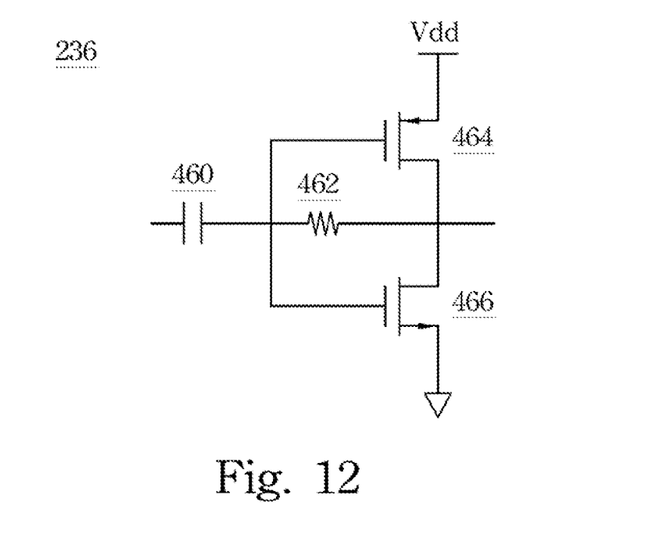
FIG. 12 is a circuit diagram of an AC coupled amplifier of FIG. 6.

FIG. 12 is a circuit diagram of the AC coupled amplifier 236 of FIG. 6. The AC coupled amplifier 236 includes a capacitor 460, a feedback resistor 462, a PMOS 464 and a NMOS 466. In this way, the capacitor 460 receives the demodulated signal that the limiter 234 amplifies. Then, the connection point, connected to the feedback resistor 462, the PMOS 464 and the NMOS 466, outputs the demodulated signal to the receiver buffer 238 to drive the capacitive load, where the AC coupled amplifier 236 increases the amplitude of the output demodulated signal is increased. For example, this circuit can amplify the swing and the output signal swing at 0.9 Volt, and the capacitive load is about 20 pF.

In this embodiment, the multi-chip stack structure 002 has a longer communication distance of about 30 μm as compared with capacitive interconnect. The longer distance means that it can resist the alignment mismatches and increase the yields for packaging. This method has energy efficiency to 6.77 pJ/bit at 3.5 Gbps. The proposed wireless interconnect is implemented in TSMC 0.18 μm process for the demonstration of this architecture.

In view of the above, a multi-chip stack structure includes a plurality of chips that are stacked, in which at least two chips 100 and 200 each include at least one series capacitor and an inductance coil connected to each other in series. In the chips 100 and 200, the series capacitors and the magnetically coupled inductance coils constitute the coupling filter 300.

The chips 100 and 200 may be adjacent to each other. Alternatively, another chip will be disposed between the chips 100 and 200 if the thickness of the middle chip is thin enough. Those with ordinary skill in the art may design the relative positions of the chips 100 and 200 depending on the desired application.

Of the chips 100 and 200, each chip may include at least one shunt capacitor connected to the inductance coil in parallel. In the chips 100 and 200, the capacitors and the magnetically coupled inductance coils constitute the coupling filter 300. In the semiconductor process, the area of those capacitors in the chip is very small.

Figure 13:
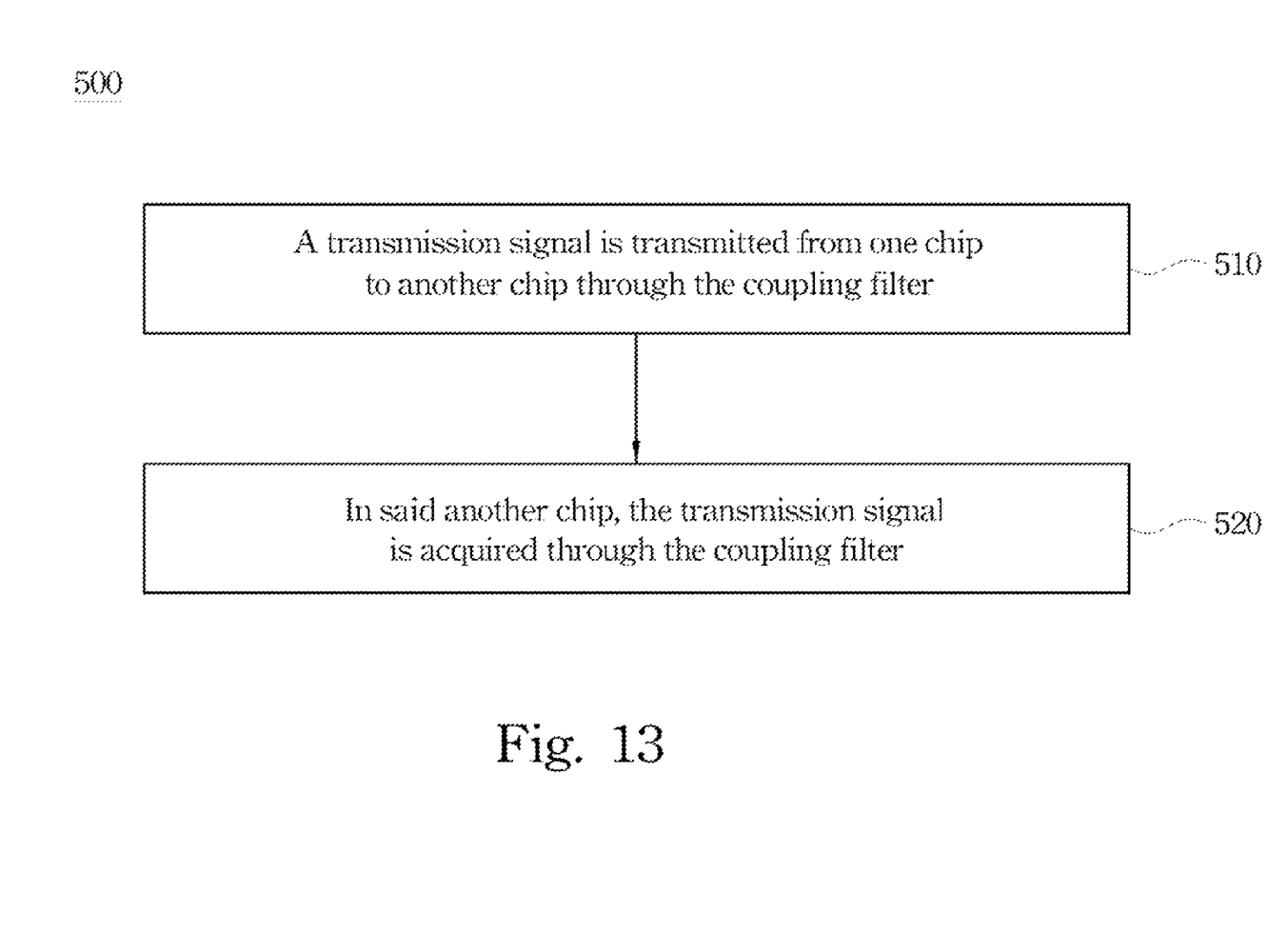
FIG. 13 is a flowchart of a signal transmission method for the multi-chip stack structure according to one embodiment of the present disclosure.

FIG. 13 is a flowchart of a signal transmission method 500 for the multi-chip stack structure according to one embodiment of the present disclosure. In FIG. 13, the signal transmission method 500 includes steps 510 and 520 as follows (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 510, a transmission signal is transmitted from one of the aforesaid two chips to the second chip through the coupling filter. In step 520, the second chip acquires the transmission signal through the coupling filter. Thus, the wireless transmission between the two chips is performed through the coupling filter.

Moreover, the frequency of the transmission signal can be within the band-pass band of the coupling filter, so as to facilitate the modulated signal through the coupling filter, thereby the communication quality can be improved.

In this embodiment, the step 510 can be performed in one of aforesaid two chips for transforming a digital signal into a modulated signal as the transmission signal, so that the modulated signal is transmitted to another chip through the coupling filter. Then, in step 520, in said another chip the transmission signal is acquired through the coupling filter.

Alternatively, un-modulated signals are transmitted between the two chips through the coupling filter. In another embodiment, an un-modulated signal is transmitted from one of the two chips to the second chip through the coupling filter in step 510. In step 520, the second chip acquires the un-modulated signal through the coupling filter.

In the present embodiment the signal-transmission is accomplished by means of Amplitude-shift keying (ASK). The digital signal is modulated into a ASK modulated signal based on the oscillation frequency that conforms to a mid-band frequency of the coupling filter during the step 510, wherein the ASK modulated signal serves as the modulated signal.

Moreover, during the step 520, the modulated signal that passes through the coupling filter is transformed into a demodulated signal; the demodulated signal amplified; amplitude of the demodulated signal is increased after the demodulated signal is amplified; the demodulated signal is buffered to drive a capacitive load after the amplitude of the demodulated signal is increased.

It should be noted that those implements to perform the steps in the signal transmission method 500 are disclosed in above embodiments and, thus, are not repeated herein.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A multi-chip stack structure comprising:
a first chip comprising:
a first inductance coil; and
at least one first series capacitor connected to the first inductance coil in series; and
a second chip stacked on the first chip and comprising:
a second inductance coil magnetically coupled with the first inductance coil; and
at least one second series capacitor connected to the second inductance coil in series, wherein the first and second inductance coils and the capacitors constitute a coupling filter.

2. The multi-chip stack structure of claim 1, wherein the first chip further comprising:
at least one first shunt capacitor connected to the first inductance coil in parallel, wherein the first series capacitor is electrically connected to the first shunt capacitor.

3. The multi-chip stack structure of claim 2, wherein the second chip further comprising:
at least one second shunt capacitor connected to the second inductance coil in parallel, wherein the second series capacitor is electrically connected to the second shunt capacitor, and the first and second inductance coils and the capacitors constitute a-said coupling filter.

4. The multi-chip stack structure of claim 1, wherein the first chip further comprising:
an emitter for transmitting a transmission signal to the second chip through the coupling filter.

5. The multi-chip stack structure of claim 4, wherein the second chip further comprising:
a receiver for acquiring the transmission signal through the coupling filter.

6. The multi-chip stack structure of claim 5, wherein the emitter transforms a digital signal into a modulated signal as the transmission signal and transmits the modulated signal to the receiver through the coupling filter, and the receiver receives and demodulates the modulated signal.

7. The multi-chip stack structure of claim 6, wherein the emitter comprising:
a local oscillator having an oscillation frequency conforming to a mid-band frequency of the coupling filter;
a passive mixer electrically connected to the coupling filter; and
a transmit buffer to buffer the digital signal to drive the passive mixer, so that the passive mixer modulates the digital signal into an amplitude-shift keying modulated signal based on the oscillation frequency, wherein the amplitude-shift keying modulated signal serves as the modulated signal.

8. The multi-chip stack structure of claim 6, wherein the receiver comprising:
a rectifier for transforming the modulated signal that passes through the coupling filter into a demodulated signal;
at least one limiter for amplifying the demodulated signal;
a AC coupled amplifier to increase the amplitude of the demodulated signal after the demodulated signal is amplified; and
a receiver buffer to buffer the demodulated signal to drive a capacitive load after the amplitude of the demodulated signal is increased.

9. The multi-chip stack structure of claim 1, wherein the second chip further comprising:
an emitter to transmit a transmission signal through the coupling filter to the first chip.

10. The multi-chip stack structure of claim 9, wherein the first chip further comprising:
a receiver to acquire the transmission signal through the coupling filter.

11. The multi-chip stack structure of claim 10, wherein the emitter transforms a digital signal into a modulated signal as the transmission signal and transmits the modulated signal to the receiver through the coupling filter, and the receiver receives and demodulates the modulated signal.

12. The multi-chip stack structure of claim 11, wherein the emitter comprising:
a local oscillator with an oscillation frequency conforming to a mid-band frequency of the coupling filter;
a passive mixer electrically connected to the coupling filter; and
a transmit buffer to buffer the digital signal to drive the passive mixer, so that the passive mixer modulates the digital signal into an amplitude-shift keying modulated signal based on the oscillation frequency, wherein the amplitude-shift keying modulated signal serves as the modulated signal.

13. The multi-chip stack structure of claim 12, wherein the receiver comprising:
at least one limiter for amplifying the demodulated signal;
a AC coupled amplifier to increase the amplitude of the demodulated signal after the demodulated signal is amplified; and
a receiver buffer to buffer the demodulated signal to drive a capacitive load after the amplitude of the demodulated signal is increased.

14. A multi-chip stack structure comprising a plurality of chips that are stacked, characterized in that at least two of the chips each comprise at least one series capacitor and an inductance coil connected to each other in series, wherein the series capacitors and the inductance coils constitute a coupling filter.

15. The multi-chip stack structure of claim 14, wherein the at least two of the chips each further comprising:
at least one shunt capacitor connected to the inductance coil in parallel, wherein the capacitors and the magnetically coupled inductance coils constitute the coupling filter.

16. A signal transmission method for the multi-chip stack structure of claim 14, the signal transmission method comprising:
(a) transmitting a transmission signal from one of the at least two of the chips to an other of the at least two of the chips through the coupling filter; and
(b) acquiring the transmission signal in said other chip through the coupling filter.

17. The multi-chip stack structure of claim 16, wherein the step (a) comprising:
in said one of the at least two of the chips, transforming a digital signal into a modulated signal as the transmission signal; and
transmitting the modulated signal to said other chip through the coupling filter.

18. The multi-chip stack structure of claim 17, wherein the step of transforming the digital signal into the modulated signal comprising:
modulating the digital signal into an amplitude-shift keying modulated signal based on the oscillation frequency that conforms to a mid-band frequency of the coupling filter, wherein the amplitude-shift keying modulated signal serves as the modulated signal.

19. The multi-chip stack structure of claim 18, wherein the step (b) comprising:

transforming the modulated signal that passes through the coupling filter into a demodulated signal;
amplifying the demodulated signal;
increasing amplitude of the demodulated signal after the demodulated signal is amplified; and
buffering the demodulated signal to drive a capacitive load after the amplitude of the demodulated signal is increased.

* * * * *